(12) United States Patent
Nakanishi

(10) Patent No.: US 10,650,877 B2
(45) Date of Patent: May 12, 2020

(54) MEMORY DEVICE INCLUDING VOLATILE MEMORY, NONVOLATILE MEMORY AND CONTROLLER

(71) Applicant: Toshiba Memory Corporation, Minato-ku (JP)

(72) Inventor: Yu Nakanishi, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/429,301

(22) Filed: Jun. 3, 2019

(65) Prior Publication Data

US 2019/0287608 A1 Sep. 19, 2019

Related U.S. Application Data

(63) Continuation of application No. 15/824,277, filed on Nov. 28, 2017, now Pat. No. 10,373,669, which is a continuation of application No. 15/462,150, filed on Mar. 17, 2017, now Pat. No. 9,865,323.

(60) Provisional application No. 62/431,140, filed on Dec. 7, 2016.

(51) Int. Cl.
*G11C 11/40* (2006.01)
*G11C 11/406* (2006.01)
*G11C 11/00* (2006.01)
*G06F 12/0891* (2016.01)
*G06F 3/06* (2006.01)

(52) U.S. Cl.
CPC ........ *G11C 11/40607* (2013.01); *G06F 3/065* (2013.01); *G06F 3/0619* (2013.01); *G06F 3/0659* (2013.01); *G06F 3/0679* (2013.01); *G06F 12/0891* (2013.01); *G11C 11/005* (2013.01); *G11C 11/406* (2013.01)

(58) Field of Classification Search
CPC ................ G11C 11/005; G11C 11/406; G11C 11/40607; G06F 3/0619; G06F 3/0679; G06F 3/065; G06F 3/0659; G06F 12/0891
See application file for complete search history.

(56) References Cited

U.S. PATENT DOCUMENTS

| | | | |
|---|---|---|---|
| 6,791,877 B2 | 9/2004 | Miura | |
| 6,928,512 B2 | 8/2005 | Ayukawa et al. | |
| 7,843,752 B2 | 11/2010 | Noh | |
| 7,894,290 B2 | 2/2011 | Hoffmann | |
| 8,307,270 B2 | 11/2012 | Kim | |

(Continued)

FOREIGN PATENT DOCUMENTS

| | | |
|---|---|---|
| JP | 5060574 | 10/2002 |
| JP | 2003-6041 | 1/2003 |

*Primary Examiner* — Vanthu T Nguyen
(74) *Attorney, Agent, or Firm* — Oblon, McClelland, Maier & Neustadt, L.L.P.

(57) ABSTRACT

According to one embodiment, a memory device is connectable to a host, and includes a nonvolatile memory, a volatile memory which is used as a cache of the nonvolatile memory and has a higher access speed than the nonvolatile memory, and a controller which controls access to the nonvolatile memory and the volatile memory. The controller increments, when the controller receives a refresh command for the volatile memory from the host, a value of a refresh counter, and executes, when the value of the refresh counter exceeds a threshold, no refresh operation corresponding to the refresh command.

16 Claims, 10 Drawing Sheets

(56) References Cited

U.S. PATENT DOCUMENTS

| | | |
|---|---|---|
| 8,473,760 B2 | 6/2013 | Takeyama et al. |
| 8,547,759 B2 | 10/2013 | Kadowaki |
| 9,053,813 B2 | 6/2015 | Kang |
| 9,311,986 B2 | 4/2016 | Kim |
| 9,412,433 B2 | 8/2016 | Morgan |
| 9,547,361 B2 | 1/2017 | Taha |
| 2010/0235563 A1* | 9/2010 | Ou .................. G06F 12/0246 711/103 |
| 2014/0189215 A1 | 7/2014 | Kang et al. |
| 2017/0062040 A1 | 3/2017 | Cho |
| 2017/0192888 A1* | 7/2017 | Moon ............... G06F 12/0804 |

* cited by examiner

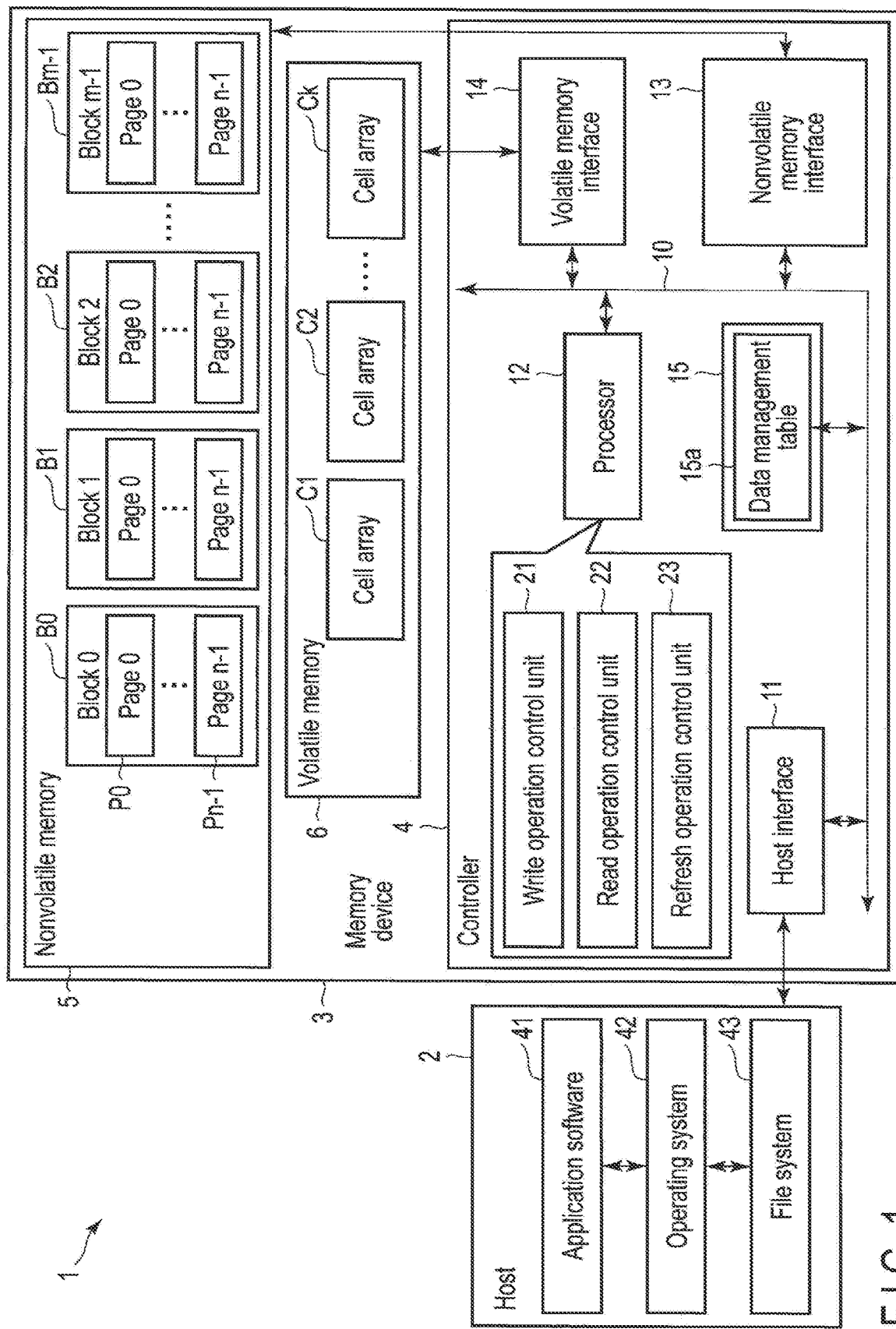
F I G. 1

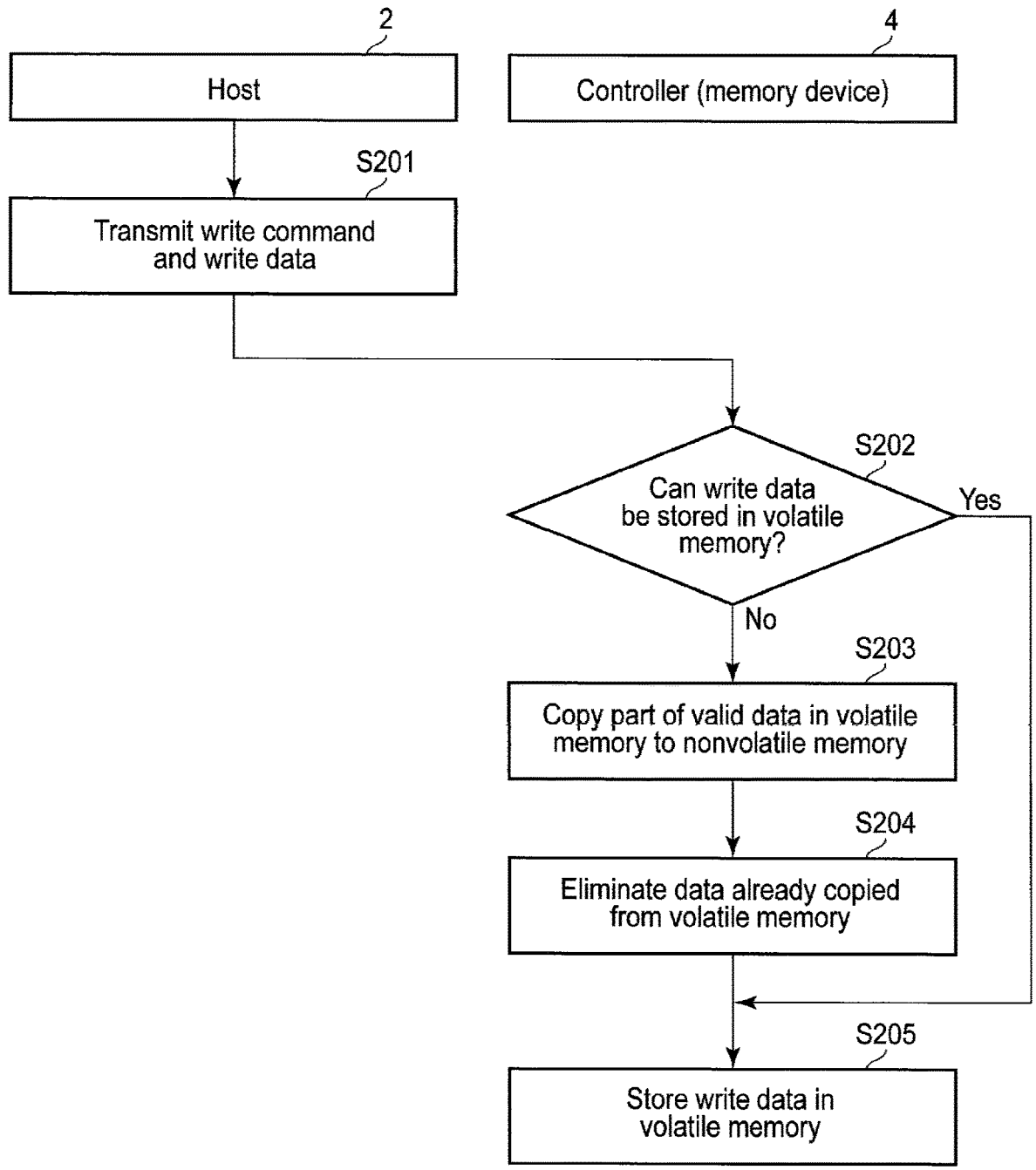
F I G. 2

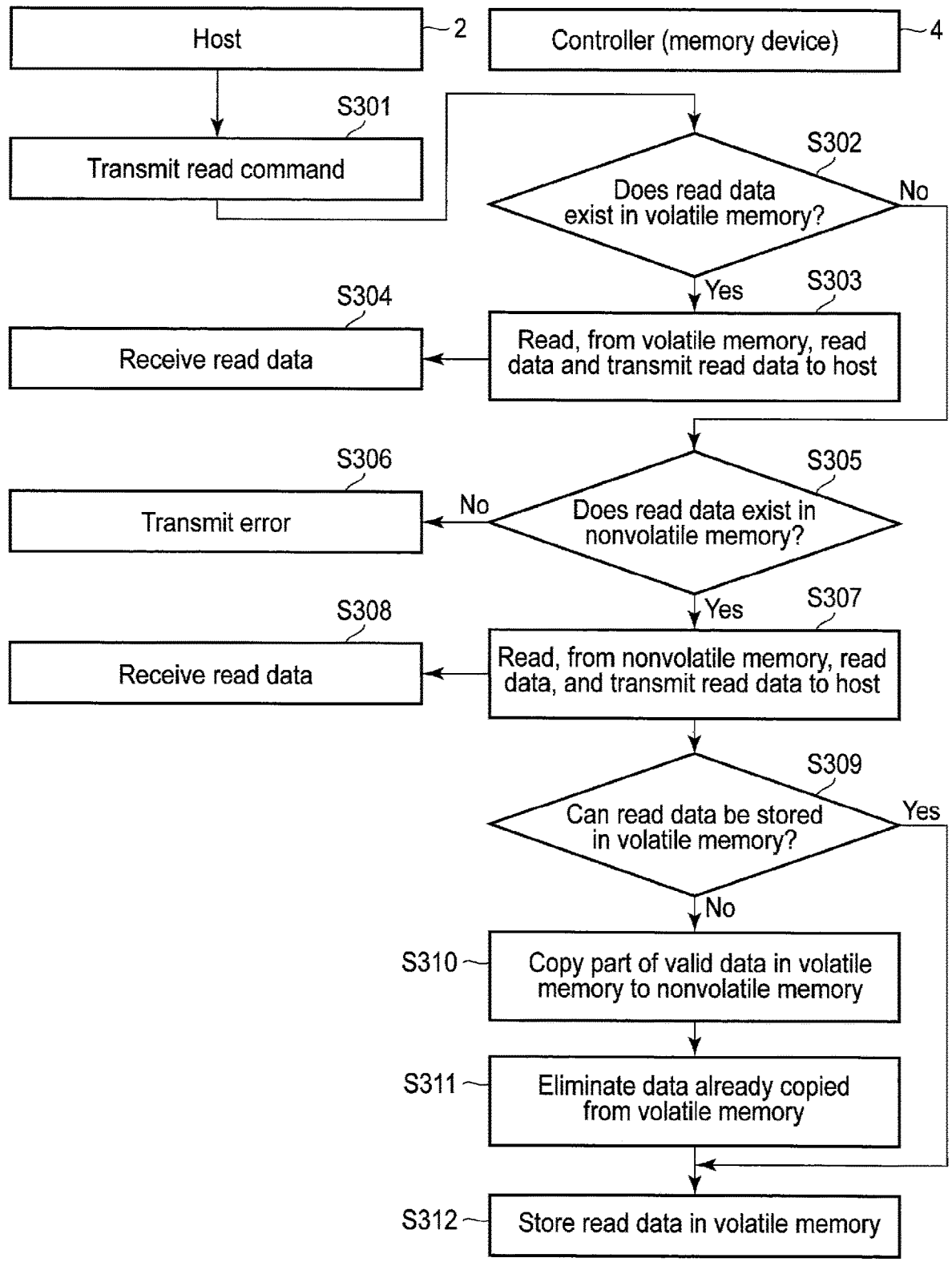
F I G. 3

| Logical address (LBA) | Data size (byte) | Already-stored data flag | Physical address |
|---|---|---|---|
| 0x001 | 1 | 1 | 0x101 (nonvolatile memory) |
| 0x002 | 2 | 0 | 0x201 (volatile memory) |
| 0x004 | 1 | 1 | 0x102 (nonvolatile memory) |
| 0x005 | 3 | 0 | 0x252 (volatile memory) |
| 0x008 | 0 | 0 | 0x205 (volatile memory) |
| ... | ... | ... | ... |

E1 / E2 / E3 / E4

F I G. 4

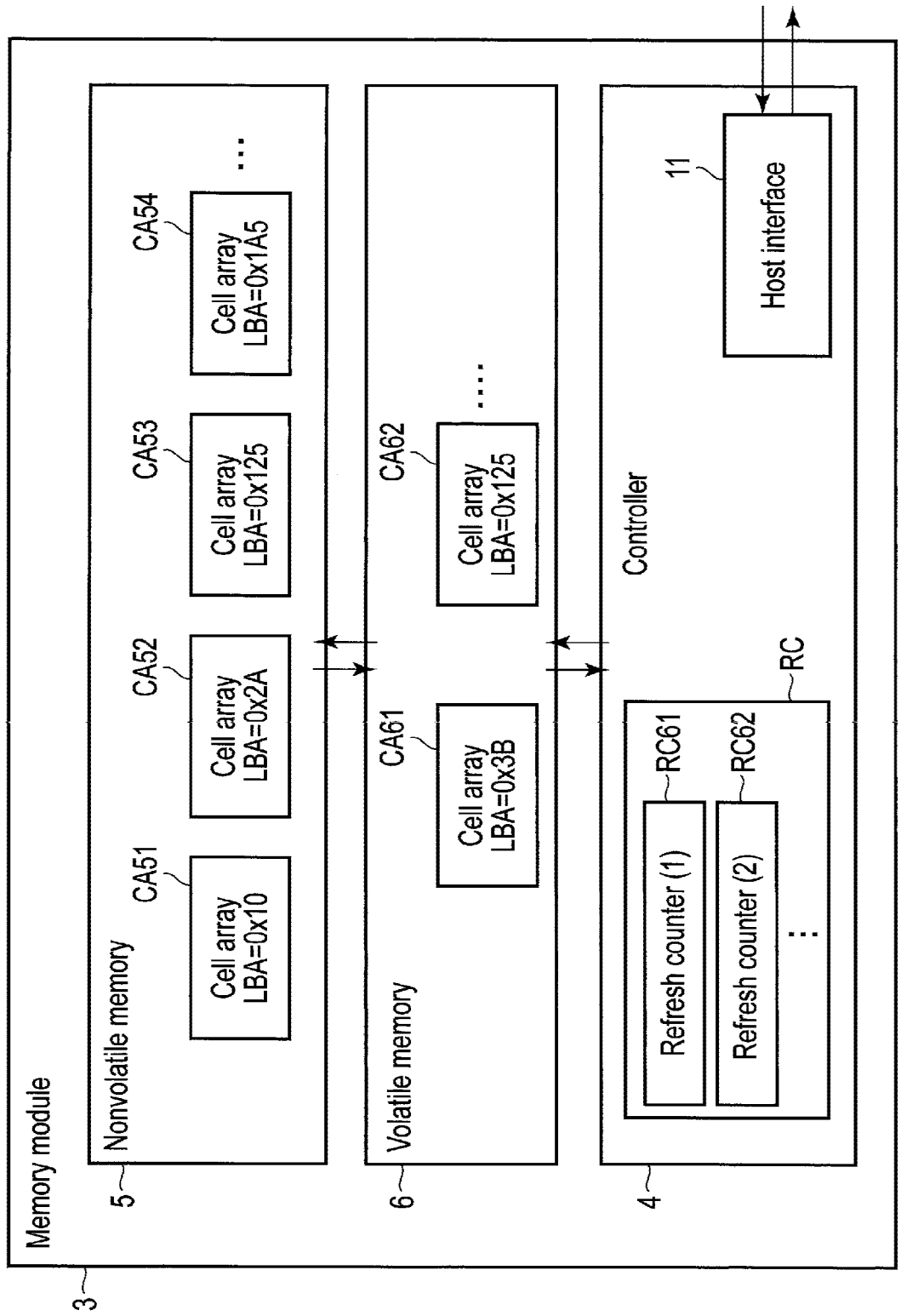
F I G. 5

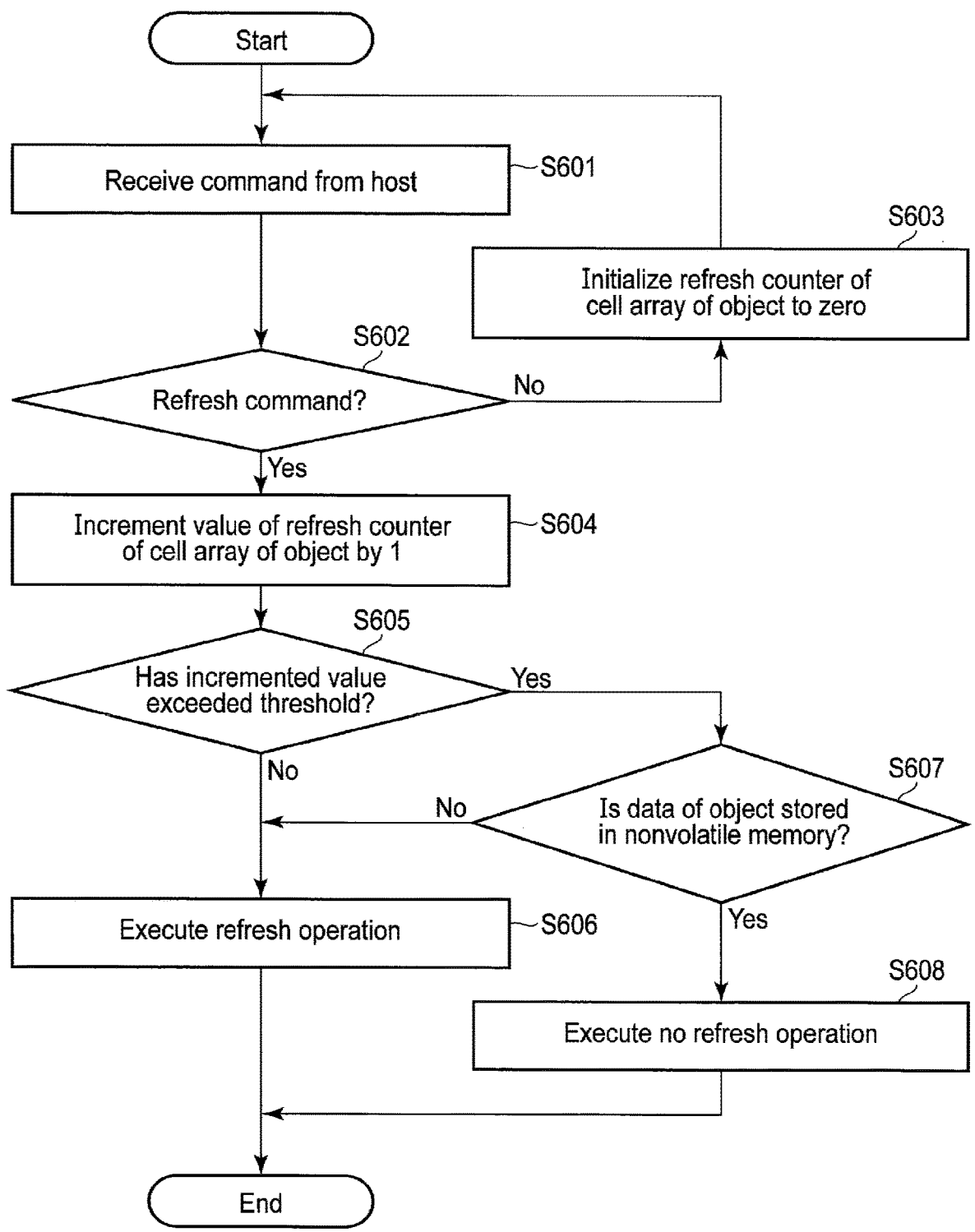
F I G. 6

MEMORY DEVICE INCLUDING VOLATILE MEMORY, NONVOLATILE MEMORY AND CONTROLLER

CROSS-REFERENCE TO RELATED APPLICATIONS

This application is a continuation of and claims the benefit of priority under 35 U.S.C. § 120 from U.S. application Ser. No. 15/824,277 filed Nov. 28, 2017, which is a continuation of U.S. application Ser. No. 15/462,150 filed Mar. 17, 2017 (now U.S. Pat. No. 9,865,323 issued Jan. 9, 2018), and claims the benefit of priority from U.S. Provisional Application No. 62/431,140 filed Dec. 7, 2016, the entire contents of each of which are incorporated herein by reference.

FIELD

Embodiments described here relate generally to a memory device including volatile memory, nonvolatile memory and controller.

BACKGROUND

As the standard for a memory module used in a computer or the like, for example, Dual Inline Memory Module (DIMM) standard or the like is known. A DIMM is generally provided with a volatile memory in which a plurality of Dynamic Random Access Memories (DRAMs) are mounted on a printed board.

BRIEF DESCRIPTION OF THE DRAWING

FIG. 1 is a block diagram exemplifying the configuration of a memory system according to a first embodiment.

FIG. 2 is a flowchart exemplifying write processing according to the first embodiment.

FIG. 3 is a flowchart exemplifying read processing according to the first embodiment.

FIG. 4 is a view exemplifying a data management table according to the first embodiment.

FIG. 5 is a conceptual diagram exemplifying transfer of data between a volatile memory and a nonvolatile memory according to the first embodiment.

FIG. 6 is a flowchart exemplifying a first refresh operation according to the first embodiment.

DETAILED DESCRIPTION

Figure 7:
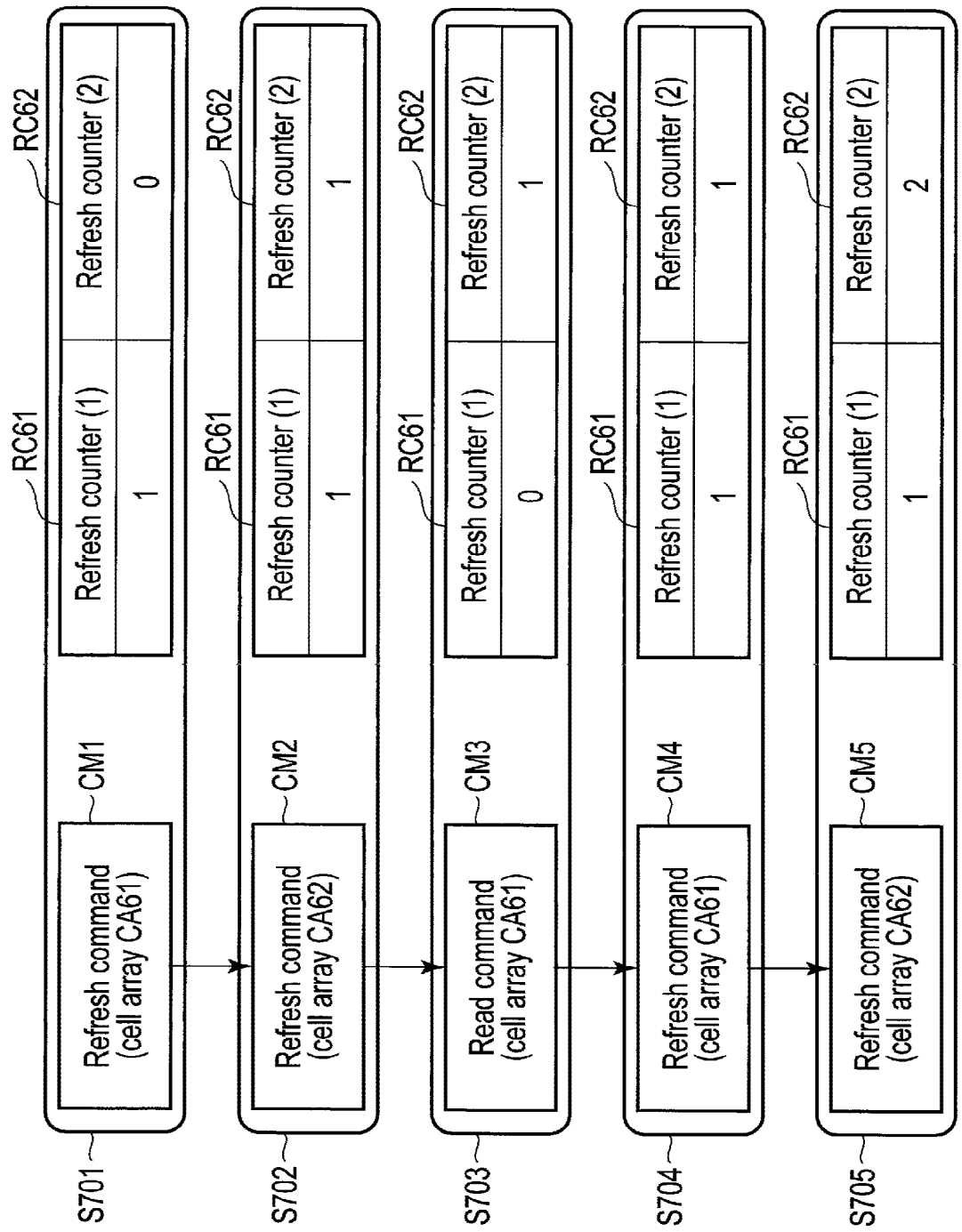
FIG. 7 is a view exemplifying the first refresh operation according to the first embodiment.

In general, according to one embodiment, a memory device is connectable to a host, and includes a nonvolatile memory, a volatile memory which is used as a cache of the nonvolatile memory and has a higher access speed than the nonvolatile memory, and a controller which controls access to the nonvolatile memory and the volatile memory. The controller increments, when the controller receives a refresh command for the volatile memory from the host, a value of a refresh counter, and executes, when the value of the refresh counter exceeds a threshold, no refresh operation corresponding to the refresh command.

Hereinafter, embodiments will be described with reference to the drawings. In the following description, substantially identical functions and constituent elements are denoted by identical reference symbols, and duplicated descriptions are given only when necessary.

First Embodiment

In general, a volatile memory has a higher access speed than a nonvolatile memory, whereas the volatile memory requires a refresh operation to be described later in order to retain data in a memory cell of the volatile memory, and thus the power consumption increases. On the other hand, the nonvolatile memory requires no refresh operation in order to retain data unlike the volatile memory, whereas the nonvolatile memory has a lower access speed than the volatile memory.

Accordingly, in a general configuration in which only volatile memories such as DIMMs or the like are used, although the access speed is high, the power consumption increases.

In this embodiment, both a volatile memory and a nonvolatile memory are included in a memory device, data of a higher access frequency is stored in the volatile memory, and data of a lower access frequency is stored in the nonvolatile memory, whereby the power consumption of the memory device is reduced without deteriorating the access speed.

FIG. 1 is a block diagram exemplifying the configuration of a memory system 1 according to this embodiment.

The memory system 1 according to this embodiment includes a host 2 and a memory device 3.

In the memory system 1, the host 2 writes data to the memory device 3, and the host 2 reads data from the memory device 3.

The host 2 is an information processing device (computing device) configured to access the memory device 3.

The host 2 is the information processing device configured to execute various programs. Programs to be executed by the information processing device include, for example, application software 41, an operating system (OS) 42, and file system 43.

The operating system 42 manages the whole of the host 2, controls the hardware in the host 2, and executes control for enabling the application software 41 to use the hardware and the memory device 3.

The file system 43 is used to execute control for an operation (creation, save, update, delete, and the like) of the file. For example, ZFS, Btrfs, XFS, ext4, NTFS, and the like may be used as the file system 43. Alternatively, a file object system (for example, Ceph Object Storage Daemon), or a Key Value Store System (for example, Rocks DB) may be used as the file system 43.

Various application software items 41 are executed on the application software layer. Examples of the application software items 41 are client software, database software, virtual machine, and the like.

When it is necessary for the application software 41 to transmit a request such as a read command or a write command to the memory device 3, the application software 41 transmits the request to the operating system 42. The operating system 42 transmits the request to the file system 43. The file system 43 converts the request into a command (read command, write command, and the like). The file system 43 transmits the command to the memory device 3.

Upon receipt of a response from the memory device 3, the file system 43 transmits the response to the operating system 42. The operating system 42 transmits the response to the application software 41.

The host 2 may be, for example, a personal computer, server unit, and the like. The host 2 may include the memory device 3, and the host 2 and the memory device 3 may be included in, for example, one information processing device.

The memory device 3 may be used as an exchangeable memory module for an information processing device functioning as the host 2.

The host 2 and the memory device 3 are connected to each other in conformity with, for example, the Double Data Rate (DDR) standard, and communication is executed between them. However, a standard other than the above standard may be applied to the communication between the host 2 and the memory device 3.

The memory device 3 is provided with a controller 4, nonvolatile memory 5, and volatile memory 6. The controller 4 receives a command from the host 2, and processes the command.

The controller 4 includes a host interface 11, processor 12, nonvolatile memory interface 13, volatile memory interface 14, and memory 15 configured to store therein a data management table 15a, and the like, and these components are connected to each other through a bus 10. It should be noted that part or the whole of the data management table 15a may be stored in at least one of the nonvolatile memory 5 and the volatile memory 6.

The host interface 11 receives or transmits various commands (for example, a write command, read command, refresh command, erase command, UNMAP/Trim command, and the like), addresses, data, information, and signals from or to the host 2.

It should be noted that the host interface 11 may not be included in the controller 4. That is, the controller 4 may be configured to execute reception or transmission of data, commands and responses from or to the host 2 through the external host interface 11 not included in the controller 4.

The controller 4 is electrically connected to the nonvolatile memory 5 through the nonvolatile memory interface 13. The nonvolatile memory interface 13 may be, for example, Toggle, ONFI or the like. The controller 4 can function as, for example, a Flash Translation Layer (FTL) configured to execute data management of the nonvolatile memory 5, and block management of the nonvolatile memory 5.

Furthermore, the controller 4 is electrically connected to the volatile memory 6 through the volatile memory interface 14.

The processor 12 controls the host interface 11, the nonvolatile memory interface 13, and the volatile memory interface 14. The processor 12 executes command processing and the like for processing various commands from the host 2 in addition to the processing of the FTL described above. Among the command processing, processing for the write command may include data compression processing, and processing for the read command may include data decompression processing. The data compression/decompression processing may be executed by the processor 12 or may be executed by dedicated hardware.

The FTL processing and the command processing may be controlled by firmware to be executed by the processor 12. The firmware makes the processor 12 function as a write operation control unit 21, a read operation control unit 22, and a refresh operation control unit 23.

The write operation control unit 21 receives data from the host 2 in response to reception of a write command (write request) from the host 2. Then, the write operation control unit 21 temporarily stores the data in the volatile memory 6, and thereafter stores data items which can be stored in the nonvolatile memory 5 among the data items stored in the volatile memory 6 in a storage area in the nonvolatile memory 5. Here, the write operation control unit 21 may store compressed data in the nonvolatile memory 5.

When a logical address of an object to be read is specified by a read command (read request) from the host 2, the read operation control unit 22 reads data from the volatile memory 6 or from the nonvolatile memory 5 on the basis of a physical address mapped to the logical address of the object to be read. Then, the read operation control unit 22 transmits the read data (data which is the object to be read) to the host 2 through the host interface 11. Here, the read operation control unit 22 may decompress the compressed data, and may return the decompressed data to the host 2 through the host interface 11.

The refresh operation control unit 23 controls a refresh operation of the volatile memory 6. Details of the refresh operation will be described later.

It should be noted that as the processor 12, for example, a Central Processing Unit (CPU), Microprocessor Unit (MPU), Digital Signal Processor (DSP), and the like are utilized.

The data management table 15a manages information indicating whether or not data included in the volatile memory 6 is stored in the nonvolatile memory 5. Further, in this embodiment, the data management table 15a may include mapping information (for example, an address translation table) indicating correspondence relationships between logical addresses and physical addresses of the nonvolatile memory 5 or the volatile memory 6. Details of the data management table 15a will be described later in connection with FIG. 4.

Here, a logical address means an address used by the host 2 for addressing of the memory device 3. This logical address may be a logical block address (LBA). In the following description, a case where the logical address is an LBA is assumed.

The nonvolatile memory 5 may include, although in a non-limiting manner, a plurality of NAND flash memory chips. The nonvolatile memory 5 includes a memory cell array. This memory cell array includes a plurality of NAND blocks (blocks) B0 to Bm−1. The blocks B0 to Bm−1 function as an erase unit. The block is called a "physical block" or an "erase block" in some cases.

The blocks B0 to Bm−1 include a plurality of pages (physical pages). That is, each of the blocks B0 to Bm−1 includes pages P0 to Pn−1. In the nonvolatile memory 5, read of data and write of data are executed in units of pages. Erase of data is executed in units of blocks.

It should be noted that the controller 4 may execute processing for concealing read/write in units of pages, and an erase operation in units of blocks.

The nonvolatile memory 5 is not limited to the NAND flash memory, and may also be other nonvolatile semiconductor memories such as a NOR-type flash memory, Magnetoresistive Random Access Memory (MRAM), Phase change Random Access Memory (PRAM), Resistive Random Access Memory (ReRAM), Ferroelectric Random Access Memory (FeRAM), and the like. For example, the nonvolatile memory 5 may be other nonvolatile memories, magnetic memories, and the like. For example, the nonvolatile memory 5 may be a semiconductor memory of a three-dimensional structure.

The nonvolatile memory 5 includes a cell array inside. The nonvolatile memory 5 stores therein data in specific units. The specific unit may be, for example, one page or may be a plurality of pages.

The volatile memory 6 is, for example, a Dynamic Random Access Memory (DRAM). However, the volatile memory 6 may be other random access memories having a higher access speed than the nonvolatile memory 5, and having the number of times data can be written larger than the nonvolatile memory 5. The volatile memory 6 may be provided on the host 2 side or may be provided in both the host 2 and the memory device 3.

The volatile memory 6 has a refresh function. In this embodiment, the refresh function means a function by which the volatile memory 6 executes rewrite of valid data according to control of the controller 4 in order to retain the valid data of the volatile memory 6. The host 2 transmits, for example, a refresh command to the memory device 3 at regular intervals in some cases. When receiving refresh commands from the host 2, the refresh operation control unit 23 counts the number of times refresh commands have consecutively been received, and determines whether or not a refresh operation should be executed on the basis of the count value.

The volatile memory includes cell arrays C1 to Ck inside. It is desirable that the size of data storable in each of the cell arrays C1 to Ck be equivalent to the size of data storable in the cell array included in the nonvolatile memory 5.

In this embodiment, the host 2 transmits a read command, write command, refresh command, and other various commands (other various requests) to the memory device 3.

For example, a read command is a command requesting the memory device 3 to read data. The read command includes, for example, an LBA (top LBA) of read data and a data length (transfer length) of the read data.

A write command is a command requesting the memory device 3 to write data. The write command includes, for example, an LBA (top LBA) of write data (data to be written) and a data length (transfer length) of the write data.

A refresh command is a command requesting the volatile memory 6 to execute a refresh operation. The refresh command can specify, for example, data or an area of the volatile memory 6, the data or the area being an object of the refresh operation. The refresh command may be able to specify, for example, an LBA of the volatile memory 6, the LBA being an object of the refresh operation or may be able to specify a cell array of the volatile memory 6. The refresh command may be able to specify an object of a refresh operation in the volatile memory 6, for example, in units of one page, in units of a plurality of pages, in units of one block, in units of a plurality of blocks, in units of one cell array, and in units of a plurality of cell arrays of the nonvolatile memory 5. The size of an area of the volatile memory 6 corresponding to a refresh command may be freely settable.

As described above, in order to retain valid data stored in the volatile memory 6 on the memory cell for a long time, it is necessary to cause a refresh operation to be executed by the refresh function provided to the volatile memory 6. In the refresh operation, the memory cell is charged with electric charges, and hence the power consumption of the memory device 3 is increased. Conversely, the nonvolatile memory 5 can retain valid data without executing a refresh operation.

Thus, in this embodiment, when data identical to the valid data stored in the nonvolatile memory 5 is stored in the volatile memory 6, and the data concerned is not an object of an operation other than the refresh operation, the refresh operation control unit 23 does not execute a refresh operation for the data concerned, thereby reducing the power consumption of the memory device 3. In this case, the data concerned is eliminated from the volatile memory 6, and hence the refresh operation control unit 23 updates mapping information included in the data management table 15a associated with the data concerned with a physical address indicating the nonvolatile memory 5.

Further, in this embodiment, when data for which it has been determined that no refresh operation is to be executed is not stored in the nonvolatile memory 5, the refresh operation control unit 23 may select one of processing of executing a refresh operation to thereby retain the data concerned on the volatile memory 6, and processing of copying (write back) the data concerned to the nonvolatile memory 5, and thereafter executing no refresh operation, and may execute the selected processing.

FIG. 2 is a flowchart exemplifying write processing according to this embodiment.

The write processing is executed between the host 2 and the controller 4 of the memory device 3.

In step S201, the host 2 transmits a write command and write data to the memory device 3.

In step S202, upon receipt of a write command from the host 2 through the host interface 11, the write operation control unit 21 of the controller 4 determines whether or not there is an area in which write data can be stored in the volatile memory 6. As the area in which write data can be stored, for example, a free area in which no data is stored will do, an area from which data is deleted or eliminated, and in which no new data is thereafter stored will do, and an area of the volatile memory 6 in which data after copying (write back) from the volatile memory 6 to the nonvolatile memory 5 remains will also do. It should be noted that whether or not write data can be stored in the volatile memory 6 may be determined on the basis of whether or not the data size of the write data is smaller than the capacity of the area in which write data is to be stored. When there is an area in which write data can be stored in the volatile memory 6, the processing advances to step S205. On the other hand, when there is no area in which write data can be stored in the volatile memory 6, the processing advances to step S203.

In step S203, the write operation control unit 21 copies part of valid data stored in the volatile memory 6 to the nonvolatile memory 5. At this time, the write operation control unit 21 refers to the data management table 15a to thereby determine whether or not the data concerned stored in the volatile memory 6 is also stored (exists) in the nonvolatile memory 5. When the data concerned is also stored in the nonvolatile memory 5, this copying processing is unnecessary.

Furthermore, in step S204, the write operation control unit 21 may eliminate (delete) the data concerned which has already been copied to the nonvolatile memory 5 in step S203 from the volatile memory 6. When the data concerned is eliminated from the volatile memory 6, the write operation control unit 21 may update the physical address of the data management table 15a. That is, the physical address stored in the data management table 15a and indicating the data concerned of the volatile memory 6 is updated with the physical address of the nonvolatile memory 5 indicating the data concerned.

It should be noted that when it is possible in the volatile memory 6 to overwrite former data with new data without eliminating the former data like, for example, a DRAM, the processing of step S204 may be omitted. In this case, it is desirable that the update processing of the data management table 15a of step S204 described above be executed at the time of update of the data management table 15a in next step S205.

In step S205, the write operation control unit 21 stores the write data received from the host 2 in step S202 in the volatile memory 6. The write operation control unit 21 updates a physical address stored in the data management table 15a and indicating the write data concerned. Further, the refresh operation control unit 23 resets the refresh counter corresponding to the write data concerned. Reset of the refresh counter may be executed by the write operation control unit 21.

It should be noted that in step S202, information indicating that use of the nonvolatile memory 5 should be restrained may be included in the write command received from the host 2. In this case, the write operation control unit 21 may determine that use of the nonvolatile memory should be restrained, from one of an LBA specified by the write command, the information indicating that use of the nonvolatile memory 5 should be restrained, and a command type. The write data for which it is specified that use of the nonvolatile memory 5 should be restrained, and the volatile memory 6 should be used is controlled in such a manner that the write data is stored in the volatile memory 6 more preferentially than ordinary write data, and the write data has little opportunity to be stored in the nonvolatile memory 5. The write data for which it is specified that use of the nonvolatile memory 5 should be restrained, and the volatile memory 6 should be used may also be adjusted in such a manner that a threshold to be compared with the value of the refresh counter becomes larger.

Then, in step S203, the write operation control unit 21 may store the write data received from the host 2 in the nonvolatile memory 5 without storing the write data in the volatile memory 6. That is, the order of priority of data to be stored in the volatile memory 6 may be freely settable by the controller 4.

FIG. 3 is a flowchart exemplifying read processing according to this embodiment.

The read processing is executed between the host 2 and the controller 4 of the memory device 3.

In step S301, the host 2 transmits a read command to the memory device 3.

In step S302, when the host interface 11 of the controller 4 receives the read command from the host 2, the read operation control unit 22 determines whether or not read data requested by the host 2 to be read is stored in the volatile memory 6 through the volatile memory interface 14 or by referring to the data management table 15a. When the read data concerned is stored therein, the read operation control unit 22 reads the read data concerned from the volatile memory 6 in step S303, and transfers the read data to the host 2. In this case, the refresh operation control unit 23 resets the refresh counter corresponding to the read data concerned. Reset of the refresh counter may be executed by the read operation control unit 22. Then, in step S304, the host 2 receives the read data concerned.

On the other hand, when no read data is stored in the volatile memory 6, the processing advances to step S305.

In step S305, the read operation control unit 22 determines whether or not the read data concerned is stored in the nonvolatile memory 5 through the nonvolatile memory interface 13 or by referring to the data management table 15a. When the read data concerned is not stored in the nonvolatile memory 5, the read data concerned does not exist in the memory device 3, and hence the read operation control unit 22 cannot transmit the read data concerned to the host 2. In this case, in step S306, the read operation control unit 22 may return an error to the host 2.

On the other hand, when the read data concerned is stored in the nonvolatile memory 5 in step S305, the read operation control unit 22 reads the read data concerned from the nonvolatile memory 5 in step S307, and transfers the read data to the host 2. In this case, in the same manner as in step S303, the refresh operation control unit 23 resets the refresh counter corresponding to the read data concerned. Furthermore, in step S308, the host 2 receives the read data concerned.

Further, in this case, the read operation control unit 22 copies the read data concerned to the volatile memory 6. It should be noted that the processing (steps S309 to S312) of copying the read data concerned to the volatile memory 6 executed by the read operation control unit 22 is identical to the processing (steps S202 to S205) of storing the write data in the volatile memory 6 in FIG. 2 executed by the write operation control unit 21.

FIG. 4 is a view exemplifying the data management table 15a according to this embodiment. In this FIG. 4, among the items in the data management table 15a, information indicating whether or not data stored in the volatile memory 6 is already stored in the nonvolatile memory 5, and mapping information (address translation table) indicating correspondence relationships between logical addresses and physical addresses of the nonvolatile memory 5 or the volatile memory 6 are exemplified.

The data management table 15a manages, for example, the logical address E1, data size E2, already-stored data flag E3, and physical address E4.

The logical address E1 indicates, for example, a top LBA of data stored in the volatile memory 6.

The data size E2 indicates a data size of data of the logical address E1.

The already-stored data flag E3 is a flag indicating whether or not data of the logical address E1 has already been stored in the nonvolatile memory 5. For example, when data stored in the volatile memory 6, and having the top logical address of 0x001 ("0x" is a prefix character indicating that a number is a hexadecimal number) has already been stored in the nonvolatile memory 5, the already-stored data flag E3 is turned on ("1"). Further, for example, when data stored in the volatile memory 6, and having the top logical address of 0x002 is not yet stored in the nonvolatile memory 5, the already-stored data flag E3 is turned off ("0").

The physical address E4 indicates a physical address of the nonvolatile memory 5 or the volatile memory 6 corresponding to the logical address E1. That is, the data management table 15a includes the address translation table described above by virtue of the mapping between the logical address E1 and the physical address E4. For example, when data is stored in the volatile memory 6, the physical address E4 is the physical address of the data concerned in the volatile memory 6, and when the data concerned is not stored in the volatile memory 6 and the data concerned is stored in the nonvolatile memory 5, the physical address E4 may be the physical address of the data concerned in the nonvolatile memory 5. The controller 4 refers to the logical address E1 and the physical address E4 of the data management table 15a, whereby the controller 4 can easily grasp in which position of the nonvolatile memory 5 or the volatile memory 6 data having a certain logical address is stored.

Each time data of the volatile memory 6 is deleted from or data is added to the volatile memory 6, the refresh operation control unit 23 of the controller 4 updates the data size E2 and the already-stored data flag E3 of the logical address E1 of the data concerned managed by the data management table 15a to the latest state.

It should be noted that the data management table 15a of FIG. 4 is only an example, and may be of a form other than the above form. For example, the data management table 15a may not manage the data size E2, and may manage a logical address at the tail of each data item in place of the data size E2.

Further, for example, the already-stored data flag E3 may be one or a plurality of flags indicative of both the information indicating whether or not data has already been stored in the nonvolatile memory 5, and the information indicating whether or not data has already been stored in the volatile memory 6. Further, for example, the physical address E4 may be separately managed as a physical address of the nonvolatile memory 5, and a physical address of the volatile memory 6. In this case, whether or not the data concerned is stored in the nonvolatile memory 5 or in the volatile memory 6 may be determined on the basis of presence or absence of each physical address E4 instead of employing the already-stored data flag E3.

FIG. 5 is a conceptual diagram exemplifying transfer of data between the volatile memory 6 and the nonvolatile memory 5 according to this embodiment.

In the example of FIG. 5, the nonvolatile memory 5 includes four cell arrays (CA51 to CA54) each of which stores data therein. The logical address of the data of the cell array CA51 is 0x10, the logical address of the data of the cell array CA52 is 0x2A, the logical address of the data of the cell array CA53 is 0x125, and the logical address of the data of the cell array CA54 is 0x1A5. Further, the volatile memory 6 includes two cell arrays CA61 and CA62 each of which stores data therein. The logical address of the data of the cell array CA61 is 0x3B, and the logical address of the data of the cell array CA62 is 0x125.

The controller 4 is provided with a refresh counter RC configured to count a consecutive execution number of refresh operations for each of the cell arrays included in the volatile memory 6. In the example of FIG. 5, the refresh counter RC61 corresponds to the cell array CA61, and the refresh counter RC62 corresponds to the cell array CA62.

It should be noted that the refresh counter RC may be included in parts other than the controller 4, for example, in at least one of the volatile memory 6 and the nonvolatile memory 5.

Hereinafter, a relationship between the refresh operation and the refresh counter will be described in detail.

FIG. 6 is a flowchart exemplifying a first refresh operation according to this embodiment. In step S601, the controller 4 receives a command from the host 2. In step S602, the controller 4 determines whether or not the received command is a refresh command. When the received command is not a refresh command, the refresh operation control unit 23 of the controller 4 initializes (resets) the refresh counter of the cell array which is the object of the received command to zero in step S603.

It should be noted that a command which is an object of resetting the refresh counter may be determined in advance. That is, the refresh operation control unit 23 may reset a refresh counter of a cell array which is an object of the received command only when a predetermined command is received.

In step S602, when the received command is a refresh command, the refresh operation control unit 23 increments a refresh counter of a cell array which is an object of the received command by 1 in step S604.

It should be noted that when the command received in step S601 takes a plurality of cell arrays as objects thereof, processing of steps S602 to S604 is executed for all the cell arrays which are the objects.

In step S605, the refresh operation control unit 23 determines whether or not the value of the refresh counter incremented in step S604 has thereafter exceeded the threshold. In a case where the value of the refresh counter has not exceeded the threshold, the refresh operation control unit 23 executes a refresh operation in step S606. In a case where the value of the refresh counter has exceeded the threshold, the processing advances to step S607.

It should be noted that it is desirable that the threshold be stored in the memory 15 of the controller 4. The threshold may be determined in advance or may be made settable by, for example, the user by means of a command or the like.

In step S607, the refresh operation control unit 23 refers to the data management table 15a to thereby determine whether or not data of the cell array which is an object of the received command is stored in the nonvolatile memory 5, and determine whether or not a refresh operation should be executed. When the data concerned is not stored in the nonvolatile memory 5, the refresh operation control unit 23 advances to step S606 to execute a refresh operation. When the data concerned is stored in the nonvolatile memory 5, the refresh operation control unit 23 executes no refresh operation in step S608 to thereby eliminate (delete) the data concerned from the volatile memory 6, and deletes the mapping information associated with the data concerned which has been stored in the volatile memory 6 from the data management table 15a.

When some other predetermined command which is not a refresh command is received by the above-described processing, data of the cell array which is the object of the command is retained in the volatile memory 6 because the corresponding refresh counter is initialized to zero and the value thereof does not exceed the threshold. On the other hand, when refresh commands are consecutively received a fixed number of times, data of the cell array which is the object of the commands is eliminated from the volatile memory 6. That is, the refresh operation is not executed for data which has not been an object of an operation to be executed by a command from the host 2 for a given period of time, whereby the data concerned is eliminated from the volatile memory 6. As a result, the power consumption of the memory device 3 can be reduced.

The above-described processing of steps S601 to S608 will be described below more specifically by using the example of FIG. 5.

In FIG. 5, for example, although data of the LBA=0x3B is stored in the cell array CA61 of the volatile memory 6, the data is not stored in the nonvolatile memory 5. That is, the data of the LBA=0x3B is data which has been stored in the volatile memory 6 by a write command from the host 2, and for which copying to the nonvolatile memory 5 has not been executed yet.

Further, for example, data of the LBA=0x125 is stored in both the cell array CA62 in the volatile memory 6 and the cell array CA53 of the nonvolatile memory 5. That is, the data of the LBA=0x125 is data which has been stored in the volatile memory 6 by a write command from the host 2, for which copying to the nonvolatile memory 5 has thereafter been executed, and which has further been copied to the volatile memory 6 again by a read command or the like from the host 2.

Here, in FIG. 5, it is assumed that only refresh commands have been continued to be consecutively issued to the cell arrays CA61 and CA62 of the volatile memory 6 from the host 2 (steps S601 to S604), and the values of the refresh counters RC61 and RC62 corresponding to these cell arrays have exceeded the threshold (step S605). In this case, the data (LBA=0x125) of the cell array CA62 is stored in the nonvolatile memory 5 (step S607), and hence the refresh operation control unit 23 executes no refresh operation for the cell array CA62 (step S608).

On the other hand, the data (LBA=0x3B) of the cell array CA61 is not stored in the nonvolatile memory 5 (step S607), and hence when no refresh operation for the cell array CA61 is executed, the data (LBA=0x3B) of the cell array CA61 is lost. Accordingly, in this case, the refresh operation control unit 23 executes a refresh operation for the cell array CA61 (step S606).

FIG. 7 is a view exemplifying the first refresh operation according to this embodiment. More specifically, when the controller 4 (host interface 11) of the memory device 3 receives a refresh command from the host 2 to the two cell arrays CA61 and CA62 of the volatile memory 6, operations of the refresh counters RC61 and RC62 corresponding to these cell arrays CA61 and CA62 will be exemplified.

First, the value of each of the refresh counters RC61 and RC62 is initialized to zero at the time of turning-on of the power to the memory device 3.

In the state S701, when the host interface 11 of the controller 4 receives a refresh command CM1 for the cell array CA61 from the host 2, the refresh operation control unit 23 increments the value of the refresh counter RC61 corresponding to the cell array CA61 by 1. That is, the value of the refresh counter RC61 becomes 1, and the value of the refresh counter RC62 remains at zero.

In the state S702, when the host interface 11 receives a refresh command CM2 for the cell array CA62 from the host 2, the refresh operation control unit 23 increments the value of the refresh counter RC62 corresponding to the cell array CA62 by 1. That is, the value of the refresh counter RC61 remains at 1, and the value of the refresh counter RC62 becomes 1.

In the state S703, the host interface 11 receives a read command CM3 for the cell array CA61 from the host 2. Here, the read command CM3 is a command other than a refresh command, and hence the refresh operation control unit 23 initializes the value of the refresh counter RC61 corresponding to the cell array CA61 to zero. The value of the refresh counter RC62 remains at 1.

In the state S704, when the host interface 11 receives a refresh command CM4 for the cell array CA61 from the host 2, the refresh operation control unit 23 increments the value of the refresh counter RC61 corresponding to the cell array CA61 by 1. That is, the value of the refresh counter RC61 becomes 1, and the value of the refresh counter RC62 remains at 1.

In the state S705, when the host interface 11 receives a refresh command CM5 for the cell array CA62 from the host 2, the refresh operation control unit 23 increments the value of the refresh counter RC62 corresponding to the cell array CA62 by 1. That is, the value of the refresh counter RC61 remains at 1, and the value of the refresh counter RC62 becomes 2.

As described above, when refresh commands are consecutively issued to the volatile memory 6, the value of the refresh counter corresponding to the cell array concerned is incremented by 1. On the other hand, when a command other than a refresh command is issued to the volatile memory 6, the value of the refresh counter corresponding to the cell array concerned is initialized to zero.

Figure 8:
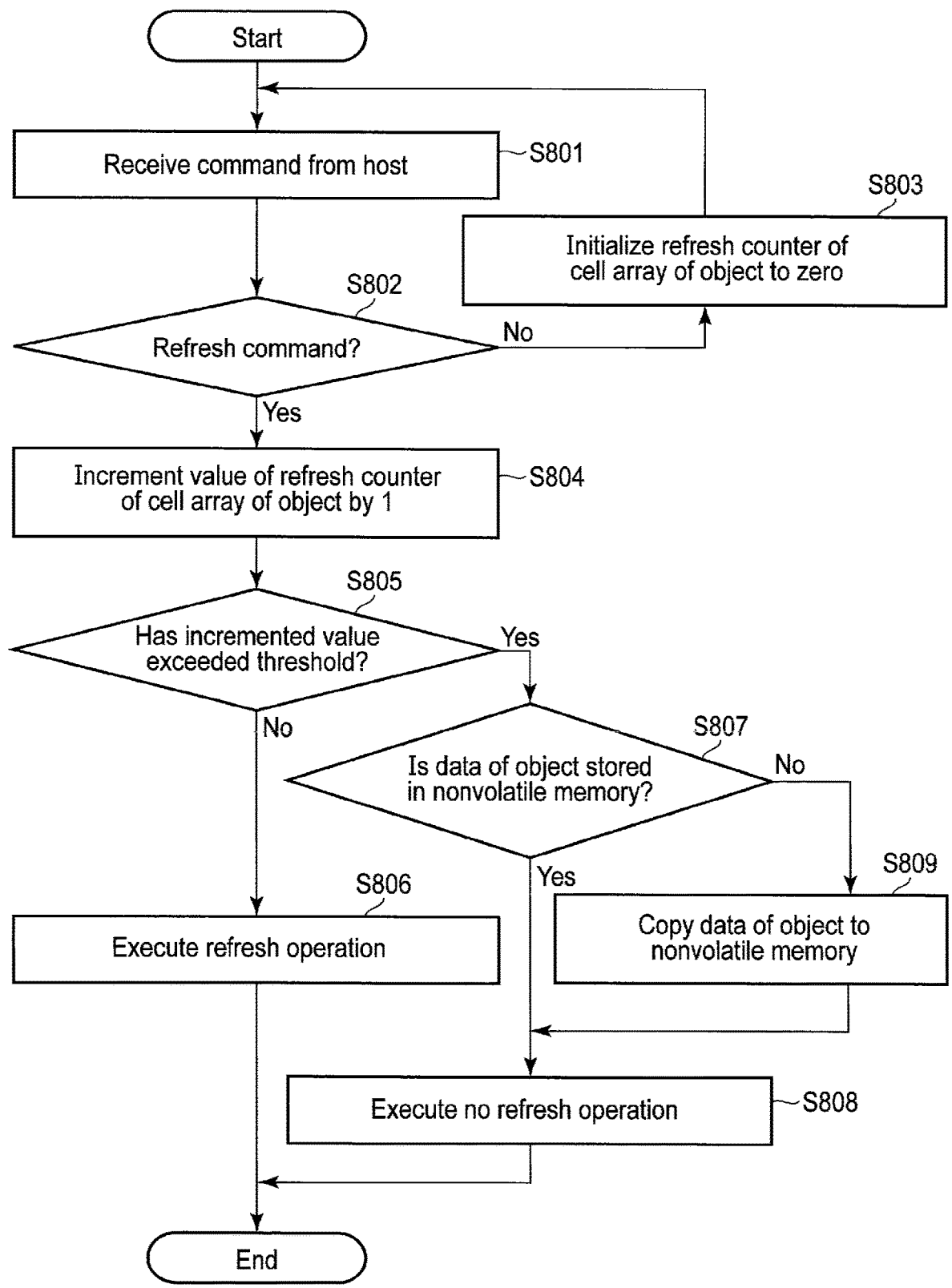
FIG. 8 is a flowchart exemplifying a second refresh operation according to the first embodiment.

FIG. 8 is a flowchart exemplifying a second refresh operation according to this embodiment.

The processing of steps S801 to S806 of FIG. 8 is identical to the processing of steps S601 to S606 of FIG. 6, and the processing of steps S807 to S809 of FIG. 8 is different from the processing of steps S607 and S608 of FIG. 6. Hereinafter, the point of difference will be described.

In step S807, the refresh operation control unit 23 refers to the data management table 15a to thereby determine whether or not the data of a cell array which is an object of the received command is stored in the nonvolatile memory 5. When the data concerned is not in the nonvolatile memory 5, the refresh operation control unit 23 copies the data of the cell array which is the object to the nonvolatile memory 5 in step S809 and, thereafter, in step S808, executes no refresh operation to thereby eliminate the data concerned from the volatile memory 6.

In other words, when the data of the cell array which is an execution object of a refresh operation is not stored in the nonvolatile memory 5, the refresh operation control unit 23 copies the data of the cell array concerned to the nonvolatile memory 5 without executing a refresh operation.

It should be noted that the processing of copying the data of the cell array concerned to the nonvolatile memory 5 in step S809 executed by the refresh operation control unit 23 is identical to the processing of steps S202 to S205 of FIG. 2.

Figure 9:
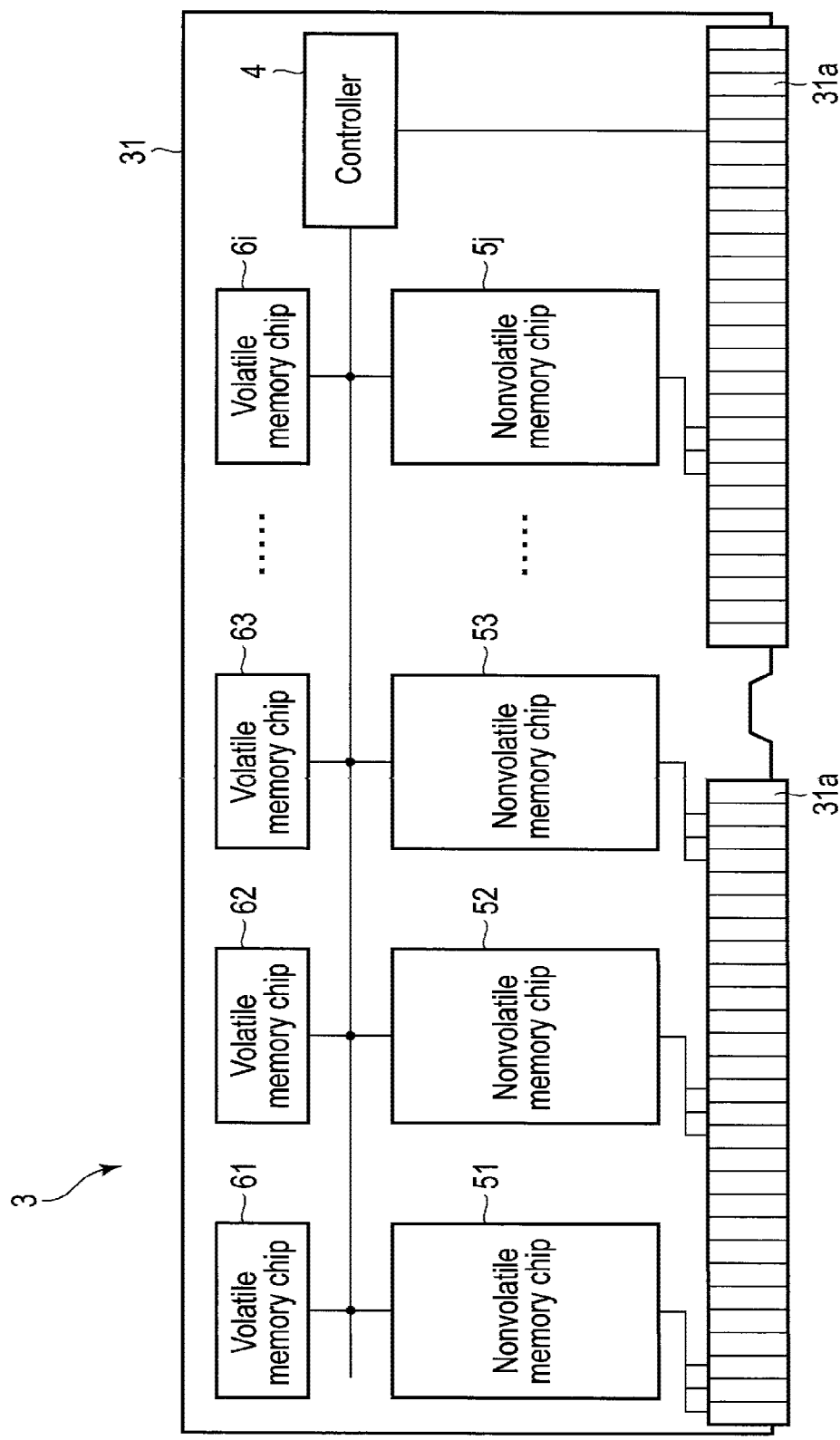
FIG. 9 is a conceptual diagram exemplifying a configuration of the memory system according to the first embodiment.

FIG. 9 is a conceptual diagram exemplifying the physical configuration of the memory device 3 according to the first embodiment.

The memory device 3 includes, on a board 31, i volatile memory chips 61 to 6i, and j nonvolatile memory chips 51 to 5j. Both of i and j are positive numbers. Data stored in the volatile memory chips 61 to 6i is stored in any one of the nonvolatile memory chips 51 to 5j, and data stored in the nonvolatile memory chips 51 to 5j is stored in any one of the volatile memory chips 61 to 6i as the need arises.

The board 31 is provided with connecting pins 31a. The controller 4, the nonvolatile memory 5, and the volatile memory 6 of the memory device 3 are connected to the host 2 and the like through the connecting pins 31a. The memory device 3 receives or transmits commands, addresses, data, information, instructions, signals, and the like from or to the information processing device concerned through the controller 4.

It should be noted that in order to manage the data to be stored in the volatile memory and the data to be stored in the nonvolatile memory by using the data management table 15a of the controller 4 in a simple way, it is desirable that the number i of the volatile memory chips and the number j of the nonvolatile memory chips be identical to each other. However, the numbers i and j may be different from each other. That is, the volatile memory chips and the nonvolatile memory chips may not correspond to each other on a one-to-one basis.

It should be noted that the memory device 3 may be implemented on the board 31 so that compatibility with the DIMM standard can be satisfied. Further, the memory device 3 is not limited to the shape shown in FIG. 9. The memory device 3 may not be implemented on an independent board, and may be incorporated in, for example, a board of some other information processing device.

In this embodiment described above, the memory device 3 determines whether or not data stored in the volatile memory 6 has been an object of an operation based on the instruction from the host 2 for a fixed period of time on the basis of the types of commands received from the host 2 through the host interface 11 during the fixed period of time. Furthermore, no refresh operation is executed for data which has not been the object of the operation from the host 2 for a fixed period of time, thereby eliminating the data concerned from the volatile memory 6. Thereby, it is possible to reduce the power consumption of the memory device 3 without lowering the speed of access to the memory device 3 to be executed by the host 2.

It should be noted that in this embodiment, although determination whether or not a refresh operation for certain data stored in the volatile memory 6 should be executed is executed by the refresh operation control unit 23 of the memory device 3, for example, when the host 2 determines that it is not necessary to retain the data concerned in the volatile memory 6, the refresh operation control unit 23 may receive an instruction from the host 2 to thereby execute no refresh operation for the data concerned. In this case, it may be instructed by, for example, a command transmitted from the host 2 to the memory device 3 that a refresh operation should not be executed.

Further, determination whether or not a refresh operation should be executed may be executed by the host 2 in place of the refresh operation control unit 23.

Further, the controller 4 may execute a refresh operation without receiving a refresh command from the host 2.

Further, the refresh counter RC may be reset at the time of power-off of the memory device 3.

In this embodiment, although it has been described that a refresh counter is provided for each cell array, for example, a refresh counter may be provided for each group of a plurality of cell arrays. In this case, when a refresh command for all of cell arrays to be associated with a certain refresh counter is received, the value of the refresh counter concerned may be incremented by 1. Further, refresh counters may be provided, for example, in units of one page, in units of a plurality of pages, in units of one block, and in units of a plurality of blocks in, for example, the volatile memory 6. The size of an area of the volatile memory 6 corresponding to a refresh counter may be made freely settable.

Second Embodiment

Figure 10:
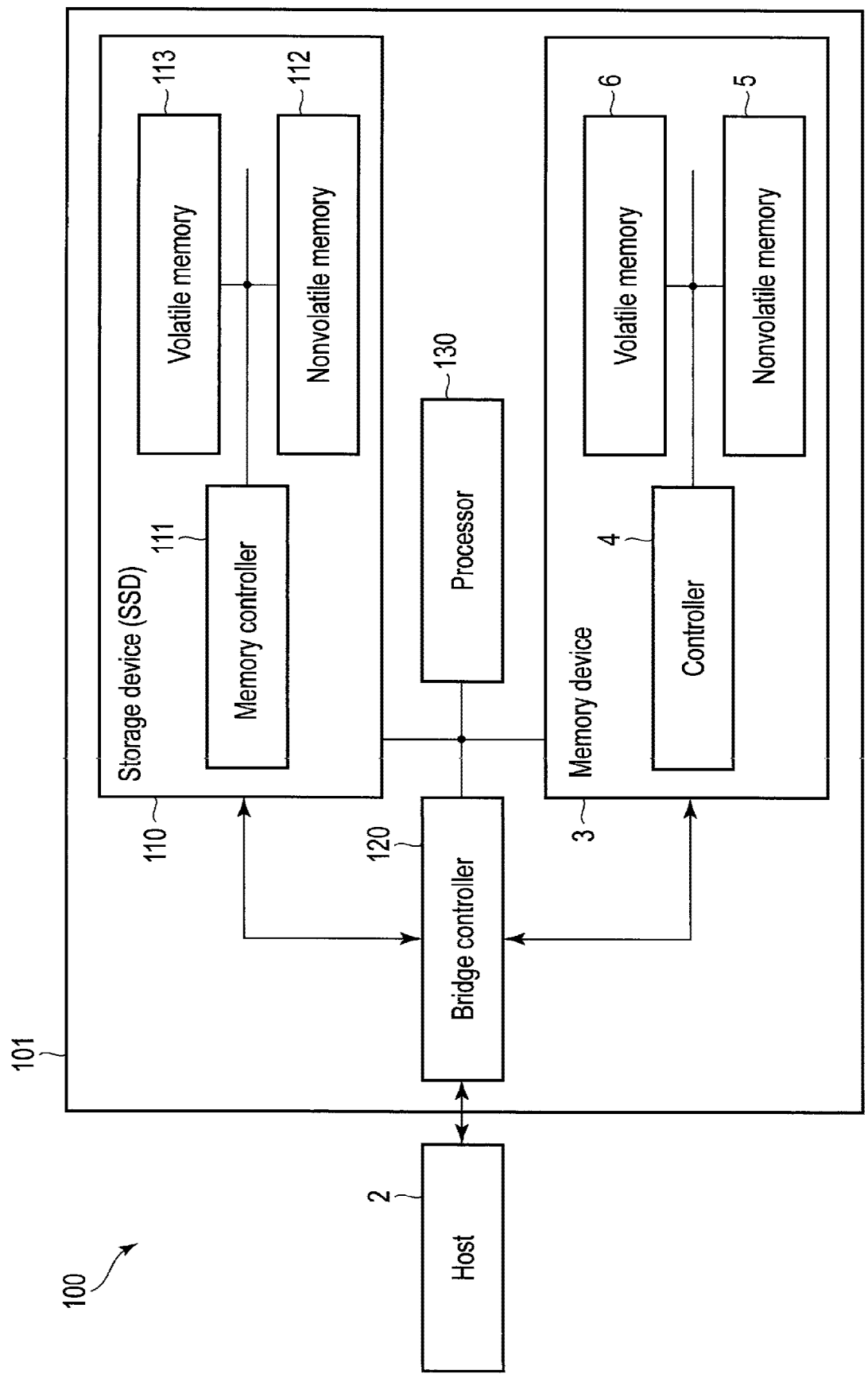
FIG. 10 is a block diagram exemplifying a configuration of an information processing system according to a second embodiment.

FIG. 10 is a block diagram exemplifying the configuration of an information processing system 100 according to a second embodiment. More specifically, FIG. 10 exemplifies the configuration of an information processing system 100 in which the memory device 3 according to the first embodiment is used.

The information processing system 100 includes a host 2, and an information processing device 101.

The information processing device 101 includes, for example, a memory device 3, storage device 110, bridge controller 120, and processor 130.

The storage device 110 is used as the main storage of the host 2. The storage device 110 may be incorporated in this information processing device or may be connected to this information processing device through a cable or a network.

The storage device 110 includes, for example, a memory controller 111, nonvolatile memory 112, and volatile memory 113.

The volatile memory 112 stores therein data received from the host 2.

The volatile memory 113 can be utilized as a buffer memory or a cache memory of the nonvolatile memory 112.

The storage device 110 is assumed to be, for example, a Solid State Drive (SSD). In this case, the nonvolatile memory 112 is, for example, a NAND-type flash memory, and the volatile memory 113 is, for example, a DRAM or a Static Random Access Memory (SRAM). However, the storage device 110 may be a storage device of some other type such as a Hard Disk Drive (HDD) or the like. In this case, the nonvolatile memory 112 is, for example, a magnetic disk. It should be noted that the nonvolatile memory 112 may be included in the memory controller 111. More specifically, for example, the nonvolatile memory 112 may be an SRAM incorporated in the memory controller 111.

The storage device 110 may store therein a program which can be executed by the processor 130.

The bridge controller 120 is provided, for example, between the memory controller 111 of the storage device 110 and the controller 4 of the memory device 3.

The processor 130 controls an operation of each component of the information processing device 101. The processor 130 is, for example, a CPU, MPU, DSP or the like. The processor 130 reads a program which can be executed by the processor 130 from the storage device 110 into the memory device 3, and executes the program.

The memory device 3 operates as a main storage device complying with the control from the processor 130. That is, in the memory device 3, data to be created on the basis of the control of the processor 130, data to be transmitted or received to or from the host 2 through the bridge controller 120, or the like is temporarily stored.

It should be noted that the bridge controller 120, the memory controller 111, and the controller 4 can freely be combined with each other or can freely be separated from each other. For example, the controller 4 or the memory controller 111 may be incorporated in the bridge controller 120. For example, they may be formed into one chip.

The memory device 3, the storage device 110, the bridge controller 120, and the processor 130 are connected to each other by an internal bus IB, and receive or transmit commands, addresses, data, information, instructions, signals, and the like from each other or to each other by the control of the bridge controller 120.

The host 2 may include the information processing device 101, and the host 2 and the information processing device 101 may be included in one information processing device.

In this embodiment described above, the information processing device 101 uses the memory device 3 as the main storage device. Thereby, it is possible, in the information processing device 101, to reduce the power consumption of the information processing device 101 without lowering the speed of access to the memory device 3. Furthermore, in the whole of the information processing system 100, it is possible to reduce the power consumption of the whole of the information processing system 100 without lowering the access speed of the host 2 and the information processing device 101.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a host being capable of transmitting a refresh command at certain intervals; and
a memory device which is connected to the host, the memory device comprising:
a nonvolatile memory;
a volatile memory which is used as a cache of the nonvolatile memory, has a higher access speed than the nonvolatile memory and is configured to execute a refresh operation in order to retain data; and
a controller which controls access to the nonvolatile memory and the volatile memory, comprises a data management table which manages a correspondence relationship between a logical address and a physical address of data in the nonvolatile memory or in the volatile memory, translates, when the controller receives a read command which addresses the logical address, the logical address into the physical address by referring the data management table, reads the data stored in the physical address, transmits the read data to the host, and executes, when the controller receives the refresh command for the volatile memory from the host, the refresh operation corresponding to the received refresh command, wherein
the controller counts a number of times the refresh command is consecutively received, and determines whether or not the controller executes the refresh operation on the basis of the counted number of times,
determines, when a write command corresponding to first data is received, whether or not an area in which the first data is storable exists in the volatile memory,
stores, when the area in which the first data is storable exists in the volatile memory, the first data in the volatile memory,
copies, when no area in which the first data is storable exists in the volatile memory, second data stored in the volatile memory to the nonvolatile memory,
stores the first data in the volatile memory in place of the second data, and
resets the number of times corresponding to the area where the first data is stored.

2. The memory system of claim 1, wherein
the controller executes, when the number of times corresponding an area in the volatile memory where third data is stored exceeds a threshold, no refresh operation corresponding to the refresh command for the third data.

3. The memory system of claim 2, wherein
the controller resets, when the controller receives a certain command which is not a refresh command for the third data stored in the volatile memory from the host, the number of times corresponding to the area where the third data is stored.

4. The memory system of claim 3, wherein
the controller stores, when the number of times corresponding to the area where the third data is stored exceeds the threshold and the third data stored in the volatile memory is not stored in the nonvolatile memory, the third data stored in the volatile memory in the nonvolatile memory without executing the refresh operation corresponding to the refresh command.

5. The memory system of claim 2, wherein
the controller executes, when the third data stored in the volatile memory is not stored in the nonvolatile memory although the number of times corresponding to the area where the third data is stored exceeds the threshold, the refresh operation.

6. The memory system of claim 1, wherein
the controller manages the number of times for each of a plurality of areas included in the volatile memory.

7. The memory system of claim 6, wherein
the controller translates, when the controller receives a read command specifying a logical address of fourth data from the host, the logical address of the fourth data into an physical address by referring the data management table,
determines whether or not the fourth data stored in the physical address of the nonvolatile memory is stored in the volatile memory,
resets, when the fourth data is stored in the volatile memory, the number of times corresponding to an area where the fourth data is stored,
reads, when the fourth data is not stored in the volatile memory, the fourth data from the nonvolatile memory, and determines whether or not an area in which the fourth data is storable exists in the volatile memory,
stores, when the area in which the fourth data is storable exists in the volatile memory, the fourth data in the volatile memory, and
copies, when no area in which the fourth data is storable exists in the volatile memory, fifth data stored in the volatile memory to the nonvolatile memory, stores the fourth data in the volatile memory in place of the fifth data, and resets the number of times corresponding to the area where the fourth data is stored.

8. The memory system of claim 1, wherein
the volatile memory is a Dynamic Random Access Memory (DRAM).

9. A memory device connectable to a host being capable of transmitting a refresh command at certain intervals, the memory device comprising:
a nonvolatile memory;
a volatile memory which is used as a cache of the nonvolatile memory, has a higher access speed than the nonvolatile memory and is configured to execute a refresh operation in order to retain data; and
a controller which controls access to the nonvolatile memory and the volatile memory, comprises a data management table which manages a correspondence relationship between a logical address and a physical address of data in the nonvolatile memory or in the volatile memory, translates, when the controller receives a read command which addresses the logical address, the logical address into the physical address by referring the data management table, reads the data stored in the physical address, transmits the read data to the host, and executes, when the controller receives the refresh command for the volatile memory from the host, the refresh operation corresponding to the received refresh command, wherein
the controller counts a number of times the refresh command is consecutively received, and determines whether or not the controller executes the refresh operation on the basis of the counted number of times,
determines, when a write command corresponding to first data is received, whether or not an area in which the first data is storable exists in the volatile memory,
stores, when the area in which the first data is storable exists in the volatile memory, the first data in the volatile memory, copies, when no area in which the first data is storable exists in the volatile memory, second data stored in the volatile memory to the nonvolatile memory, stores the first data in the volatile memory in place of the second data, and resets, the number of times corresponding to the area where the first data is stored.

10. The memory device of claim 9, wherein
the controller executes, when the number of times corresponding an area in the volatile memory where third data is stored exceeds a threshold, no refresh operation corresponding to the refresh command for the third data.

11. The memory device of claim 10, wherein
the controller resets, when the controller receives a certain command which is not a refresh command for the third data stored in the volatile memory from the host, the number of times corresponding to the area where the third data is stored.

12. The memory device of claim 11, wherein
the controller stores, when the number of times corresponding to the area where the third data is stored exceeds the threshold and the third data stored in the volatile memory is not stored in the nonvolatile memory, the third data stored in the volatile memory in the nonvolatile memory without executing the refresh operation corresponding to the refresh command.

13. The memory device of claim 10, wherein
the controller executes, when the third data stored in the volatile memory is not stored in the nonvolatile memory although the number of times corresponding to the area where the third data is stored exceeds the threshold, the refresh operation.

14. The memory device of claim 9, wherein
the controller manages the number of times for each of a plurality of areas included in the volatile memory.

15. The memory device of claim 14, wherein
the controller translates, when the controller receives a read command specifying a logical address of fourth data from the host, the logical address of the fourth data into a physical address by referring the data management table, determines whether or not the fourth data stored in the physical address of the nonvolatile memory is stored in the volatile memory, resets, when the fourth data is stored in the volatile memory, the number of times corresponding to an area where the fourth data is stored, reads, when the fourth data is not stored in the volatile memory, the fourth data from the nonvolatile memory, and determines whether or not an area in which the fourth data is storable exists in the volatile memory, stores, when the area in which the fourth data is storable exists in the volatile memory, the fourth data in the volatile memory, and copies, when no area in which the fourth data is storable exists in the volatile memory, fifth data stored in the volatile memory to the nonvolatile memory, stores the fourth data in the volatile memory in place of the fifth data, and resets the number of times corresponding to the area where the fourth data is stored.

16. The memory device of claim 9, wherein
the volatile memory is a Dynamic Random Access Memory (DRAM).

* * * * *